(12) United States Patent
Ostermayr et al.

(10) Patent No.: US 8,765,548 B2
(45) Date of Patent: Jul. 1, 2014

(54) CAPACITORS AND METHODS OF MANUFACTURE THEREOF

(71) Applicant: Infineon Technologies AG, Neubiberg (DE)

(72) Inventors: Martin Ostermayr, Beacon, NY (US); Richard Lindsay, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/017,022

(22) Filed: Sep. 3, 2013

(65) Prior Publication Data

US 2014/0004670 A1 Jan. 2, 2014

Related U.S. Application Data

(62) Division of application No. 12/127,576, filed on May 27, 2008, now Pat. No. 8,546,916.

(51) Int. Cl.
*H01L 21/8242* (2006.01)

(52) U.S. Cl.
USPC ........... 438/239; 438/238; 438/250; 438/253; 438/381; 257/E27.071

(58) Field of Classification Search
USPC ................. 257/E27.016, E27.017, E27.019, 257/E27.024, E27.071; 438/381, 393, 396, 438/197, 210, 238, 239, 250, 253, 329
See application file for complete search history.

(56) References Cited

U.S. PATENT DOCUMENTS

| | | | |
|---|---|---|---|
| 5,886,375 A | 3/1999 | Sun | |
| 6,847,075 B2 | 1/2005 | Anezaki | |
| 6,867,131 B2 | 3/2005 | Wang et al. | |
| 7,030,441 B2 | 4/2006 | Wu et al. | |
| 7,291,877 B2 | 11/2007 | Brederlow et al. | |
| 2002/0105826 A1 | 8/2002 | Yamauchi et al. | |
| 2007/0121371 A1 | 5/2007 | King | |
| 2007/0254449 A1* | 11/2007 | Coolbaugh et al. | 438/382 |
| 2009/0261396 A1* | 10/2009 | Gogoi | 257/298 |

OTHER PUBLICATIONS

"1408-9706 Capacitor Series: Reference Standard Capacitor," http://www.ietlabs.com/pdf/Datasheets/1408_9706.pdf, downloaded Apr. 9, 2008, p. 57, IET Labs, Inc., Westbury, NY.

de Moraes, R.M., et al., "Unified Model, and Novel Reverse Recovery Nonlinearities, of the Driven Diode Resonator," http://arxiv.org/PS_cache/nlin/pdf/0301/0301009v2.pdf, downloaded Apr. 9, 2008, pp. 1-10, Cornell University Library, Cornell University, Ithaca, NY.

(Continued)

*Primary Examiner* — Eduardo A Rodela
(74) *Attorney, Agent, or Firm* — Slater & Matsil, L.L.P.

(57) ABSTRACT

Semiconductor devices, capacitors, and methods of manufacture thereof are disclosed. In one embodiment, a method of fabricating a capacitor includes forming a first material over a workpiece, and patterning the first material, forming a first capacitor plate in a first region of the workpiece and forming a first element in a second region of the workpiece. A second material is formed over the workpiece and over the patterned first material. The second material is patterned, forming a capacitor dielectric and a second capacitor plate in the first region of the workpiece over the first capacitor plate and forming a second element in a third region of the workpiece.

19 Claims, 7 Drawing Sheets

(56) References Cited

OTHER PUBLICATIONS

"High-K and Metal Gate Transistors," http://www.hothardware.com/Arlicles/Intel_45nm_Fab_Process_And_Penryn_Preview1/ (printable version at http://www.hothardware.com/printarticle.aspx?articleid=926), downloaded Apr. 9, 2008, pp. 1-3, HotHardware.com, LLC.

"High-k Dielectric," Wikipedia, the free encyclopedia, http://en.wikipedia.org/wiki/High-k, downloaded Apr. 9, 2008, pp. 1-3, Wikimedia Foundation Inc., St. Petersburg, FL.

* cited by examiner

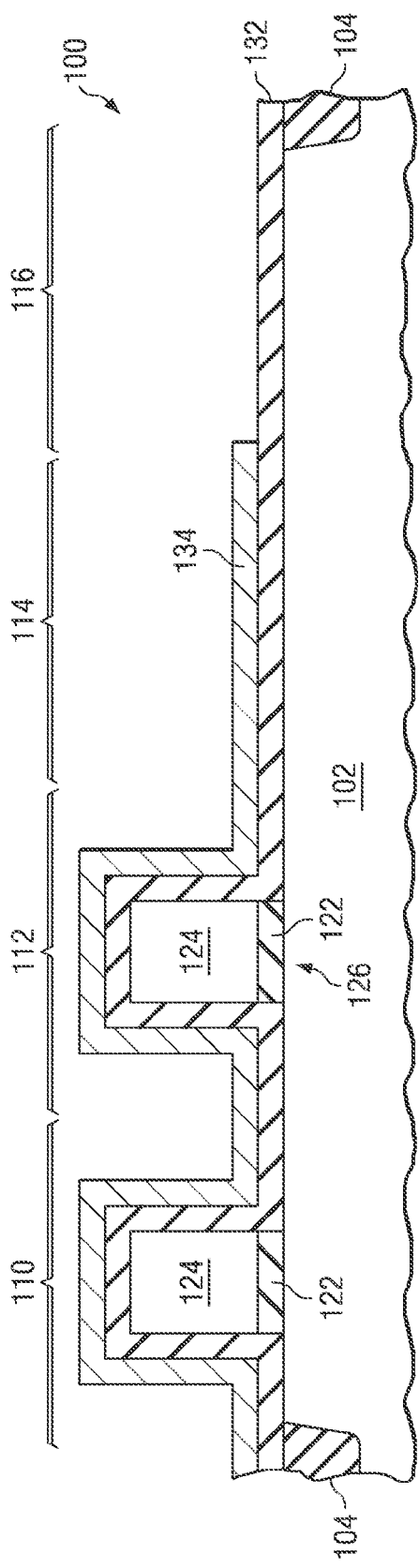
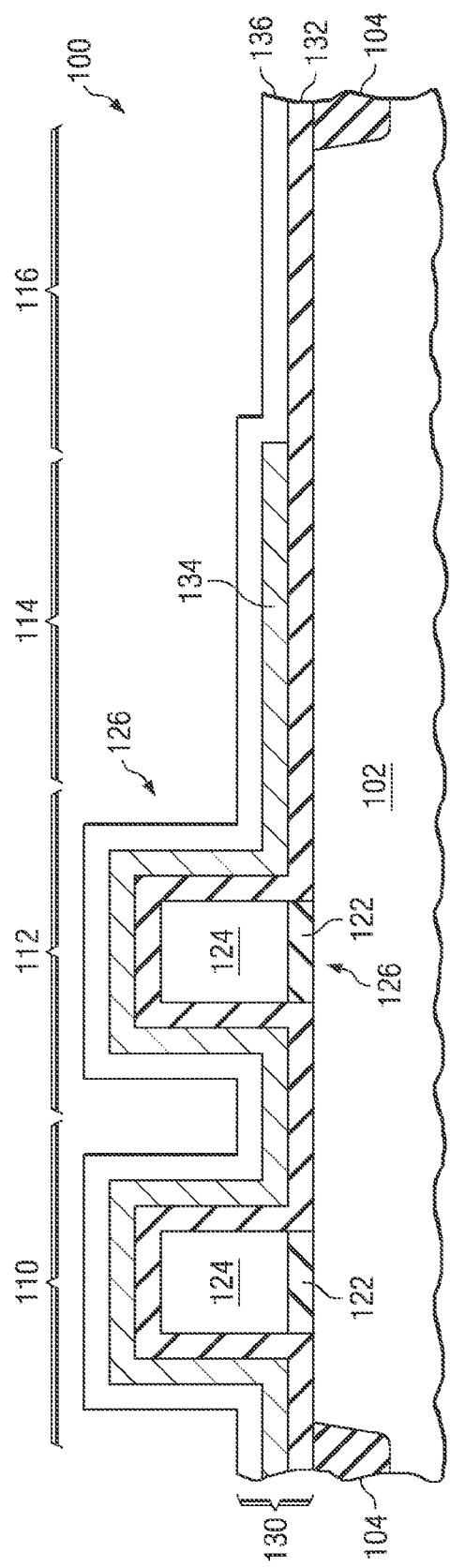

US 8,765,548 B2

CAPACITORS AND METHODS OF MANUFACTURE THEREOF

This is a divisional application of U.S. application Ser. No. 12/127,576, entitled "Capacitors and Methods of Manufacture Thereof" which was filed on May 27, 2008 and is incorporated herein by reference.

TECHNICAL FIELD

The present invention relates generally to the fabrication of semiconductor devices, and more particularly to the fabrication of capacitors in integrated circuits.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Capacitors are elements that are used extensively in semiconductor devices for storing an electrical charge. Capacitors essentially comprise two conductive plates separated by an insulating material. When an electric current is applied to a capacitor, electric charges of equal magnitude yet opposite polarity build up on the capacitor plates. The capacitance, or the amount of charge held by the capacitor per applied voltage, depends on a number of parameters, such as the area of the plates, the distance between the plates, and the dielectric constant value of the insulating material between the plates, as examples. Capacitors are used in applications such as electronic filters, analog-to-digital converters, memory devices, control applications, and many other types of semiconductor device applications.

What are needed in the art are improved methods of fabricating capacitors in semiconductor devices and structures thereof.

SUMMARY OF THE INVENTION

Technical advantages are generally achieved by preferred embodiments of the present invention, which provide novel methods of manufacturing capacitors, semiconductor devices, and structures thereof.

In accordance with one embodiment, a method of fabricating a capacitor includes forming a first material over a workpiece. The first material is patterned, forming a first capacitor plate in a first region of the workpiece and forming a first element in a second region of the workpiece. A second material is formed over the workpiece and over the patterned first material. The second material is patterned, forming a capacitor dielectric and a second capacitor plate in the first region of the workpiece over the first capacitor plate and forming a second element in a third region of the workpiece.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 6 show cross-sectional views of a semiconductor device at various stages of manufacturing in accordance with embodiments of the present invention, wherein a capacitor is formed during manufacturing process steps for other elements of a semiconductor device;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
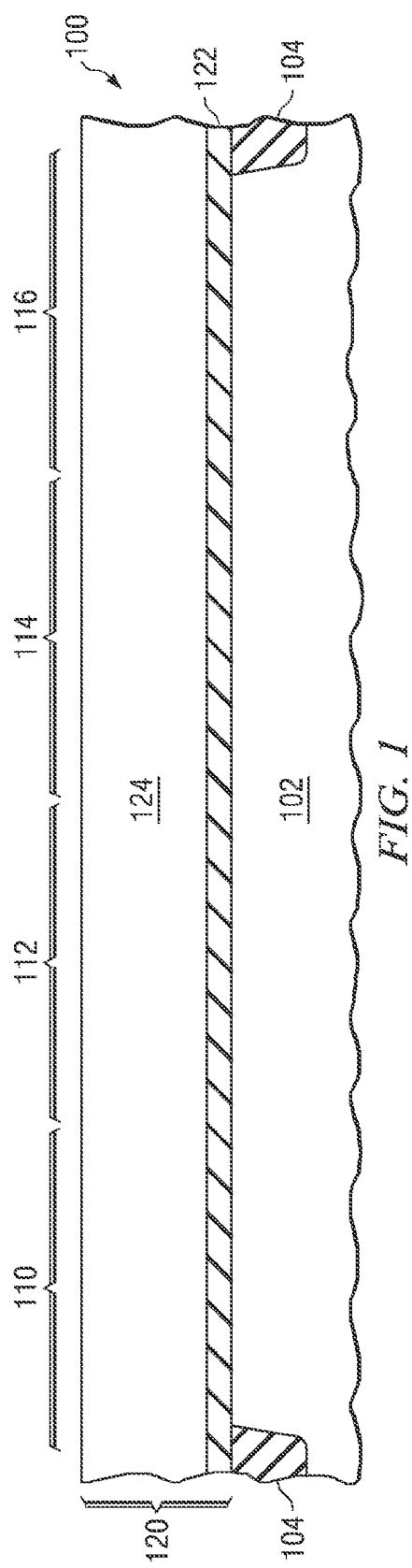

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The requirement for the use of capacitors in semiconductor devices has increased. Capacitors are used in SRAM applications such as 8T (an SRAM core cell having 8 transistors), 6T, and 3T cell arrangements for data storage, as an example. Capacitors are also used in soft error rate (SER) robustness applications, e.g., to assist in cell retention in high altitude and alpha radiation environments, as another example. Capacitors are used in logic circuits and SRAM/read-only memory (ROM) support circuits, for example. Capacitors are also used to generate negative voltages in voltage regulators or in delay circuits.

Some capacitors are formed in lower levels of semiconductor devices, e.g., between a substrate and a gate level for transistors, or between the substrate and shallow trench isolation (STI) regions. Other capacitors such as metal-insulator-metal (MIM) capacitors are formed in the upper metallization layers of a semiconductor device, for example. Capacitors consume a large amount of area and are therefore unsuitable for use in some applications, such as some SRAM core cells. Capacitors also require additional dedicated lithography masks, lithography processes, and material layers to fabricate them, increasing costs and fabrication time.

Thus, what are needed in the art are improved, cost-effective methods of fabricating capacitors in semiconductor devices.

In the past, gate dielectric materials of transistors in semiconductor devices typically comprised silicon dioxide, which has a dielectric constant or k value of about 3.9. Gate materials of transistors typically comprised polysilicon. However, in some smaller and more advanced semiconductor technologies, such as 45 nm or 32 nm, as examples, the use of gate dielectric materials comprising silicon oxynitride and other dielectric materials having a greater dielectric constant k of greater than 3.9 have begun to be a trend. Gate materials comprising metals have also begun to be used for transistors.

Embodiments of the present invention achieve technical advantages by forming capacitors or at least portions thereof using material layers for gate materials of transistor devices and material layers for other elements of semiconductor devices, to be described further herein.

The present invention will be described with respect to preferred embodiments in specific contexts, namely implemented in SRAM core cell applications. Embodiments of the invention may also be implemented in other semiconductor applications such as other types of memory devices, logic devices, power devices, SER applications, and other applications that utilize capacitors, as examples.

Embodiments of the present invention comprise novel capacitor structures that are formed simultaneously with the formation of other elements of semiconductor devices; thus, no additional material layers, lithography masks, or lithography processing steps are required to fabricate the capacitors. The capacitors may comprise a high dielectric constant (k) material and may achieve a high amount of capacitance for a minimal amount of surface area. The capacitance can be varied with the size, e.g., the width and the length, of the device and the high k material selected.

FIGS. 1 through 6 show cross-sectional views of a semiconductor device 100 at various stages of manufacturing in accordance with embodiments of the present invention, wherein a capacitor 137 is formed during manufacturing process steps for other elements of the semiconductor device 100. Referring first to FIG. 1, to manufacture the semiconductor device 100, first, a workpiece 102 is provided. The workpiece 102 may comprise a semiconductor substrate comprising silicon, body, or wafer, for example. The workpiece 102 may also include other active components or circuits formed within and/or over the workpiece 102, not shown. The workpiece 102 may comprise silicon oxide over single-crystal silicon, for example. The workpiece 102 may include other conductive layers or other semiconductor elements, e.g., transistors, diodes, etc., not shown. Compound semiconductors, GaAs, InP, Si/Ge, or SiC, as examples, may be used in place of silicon. The workpiece 102 may comprise a silicon-on-insulator (SOI) or a SiGe-on-insulator substrate, as examples.

Isolation regions 104 may be formed in the workpiece 102, as shown. The isolation regions 104 may comprise shallow trench isolation (STI) regions or other types of isolation regions such as deep trench (DT) isolation and/or field oxide (FOX) regions, for example. The isolation regions 104 may be formed by etching trenches in the workpiece 102 using lithography and filling the trenches with one or more insulating materials, for example.

The workpiece 102 comprises a first region 110, a second region 112, a third region 114, and an optional fourth region 116, as shown. The first region 110 comprises a region where a capacitor will be formed in accordance with an embodiment of the present invention. The second region 112 comprises a region where a first element such as a resistor will be formed. The third region 114 comprises a region where a second element such as a transistor will be formed. The optional fourth region 116, if included, may comprise a region where a third element such as a resistor will be formed.

Only one first region 110, second region 112, third region 114, and fourth region 116 are shown in the drawings; however, a plurality of first regions 110, second regions 112, third regions 114, and fourth regions 116 may be disposed across a surface of the workpiece 102, for example. One or more isolation regions 104 may be formed in the first region 110, second region 112, third region 114, and fourth region 116, for example, not shown. One or more isolation regions 104 may be formed between the first region 110, second region 112, third region 114, and/or fourth region 116, also not shown.

A first material 120 is formed over the workpiece 102, as shown in FIG. 1. The first material 120 may comprise a first insulating material 122 and a first semiconductive material 124 disposed over the first insulating material 122. The first insulating material 122 of the first material 120 may comprise about 0.5 to 5 nm of a dielectric material such as $SiO_2$, a nitride such as $Si_3N_4$, an oxynitride such as SiON, a high-k dielectric material having a dielectric constant k of greater than about 3.9, or combinations and/or multiple layers thereof, as examples. Alternatively, the first insulating material 122 may comprise other dimensions and materials, for example. The first insulating material 122 may be formed using an oxidation or nitridation process, chemical vapor deposition (CVD), atomic layer deposition (ALD), metal organic chemical vapor deposition (MOCVD), physical vapor deposition (PVD), a spin-on process, or jet vapor deposition (JVD), or combinations thereof, as examples, although alternatively, other methods may also be used to form the first insulating material 122.

The first semiconductive material 124 of the first material 120 is formed or deposited over the first insulating material 122. The first semiconductive material 124 may comprise about 10 to 200 nm of a semiconductive material such as polysilicon or amorphous silicon, although alternatively, the first semiconductive material 124 may comprise other dimensions and materials. In some embodiments, the first semiconductive material 124 comprises a thickness of about 50 nm, as an example. The first semiconductive material 124 may be formed by CVD, PVD, or other methods, as examples.

Figure 2:
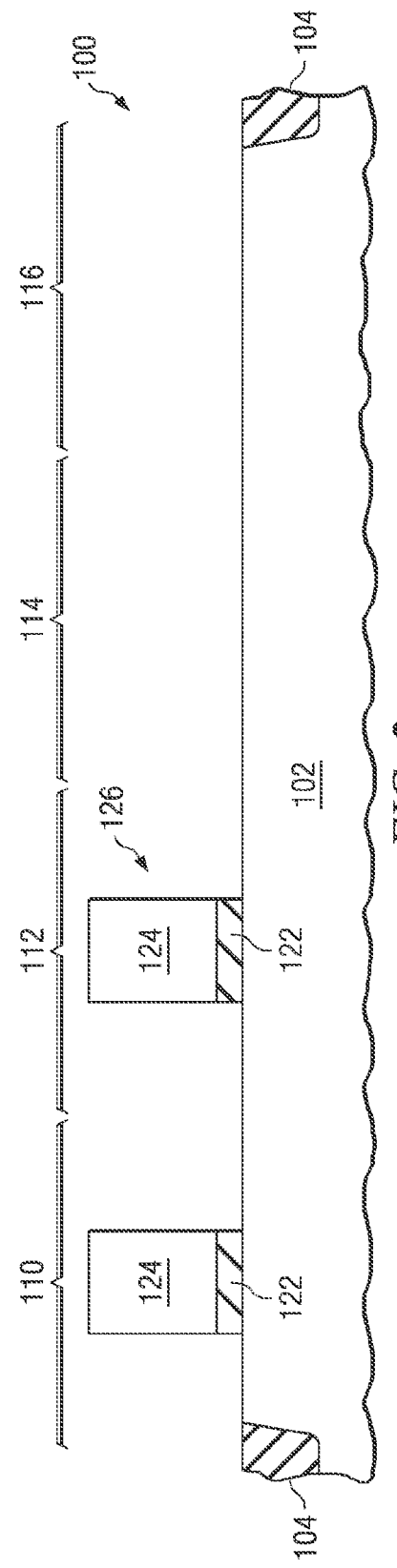

The first material 120 is patterned, forming a first capacitor plate of a capacitor 137 (see FIG. 5) in the first region 110 of the workpiece 102 and forming a first element 126 in the second region 112 of the workpiece 102, as shown in FIG. 2. In some embodiments, the first element 126 comprises a resistor 126, as one example. Alternatively, the first element 126 may comprise other devices, such as a transistor or other types of devices or circuit elements. The type of material of the first semiconductive material 124, the thickness of the first semiconductive material 124, and the dimensions of the patterned first semiconductive material 124 of the first material 120 may be selected to achieve a desired amount of resistance for the first element 126, e.g., if the first element 126 comprises a resistor. The first element 126 may comprise a width of about 50 nm and may extend in and out of the paper in the view shown in FIG. 2 by about 100 nm or greater, or several μm, as examples, depending on the application and the desired amount of resistance for the first element 126. The width of the first element 126 may be substantially the same as a gate length for transistors of the semiconductor device 100 and/or may comprise a minimum feature size for the semiconductor device 100, for example. In some embodiments and in some technology nodes, the width of the first element 126 may comprise about 20 to 50 nm or less, as an example. Alternatively, the first element 126 may comprise other dimensions.

The width and length of the first capacitor plate in the first region 110 may comprise 20 nm to several hundred nm or several μm in a top view of the semiconductor device 100, depending on the desired amount of capacitance for the capacitor 137. Alternatively, the first capacitor plate comprising the first semiconductive material 124 may comprise other dimensions.

The first material 120 may be patterned by depositing a layer of photosensitive material (not shown) over the first material 120, and patterning the layer of photosensitive material using a lithography process. Portions of the layer of photosensitive material are exposed to energy, e.g., using a lithography mask or a direct patterning method, exposing portions of the layer of photosensitive material. The layer of photosensitive material is developed, and portions of the layer of photosensitive material are then removed. The layer of photosensitive material is used as an etch mask while portions of the first material 120 are etched away using an etch process. The layer of photosensitive material is then removed. An optional hard mask (also not shown) may also be used in the lithography process to pattern the first material 120, for example.

Figure 5:
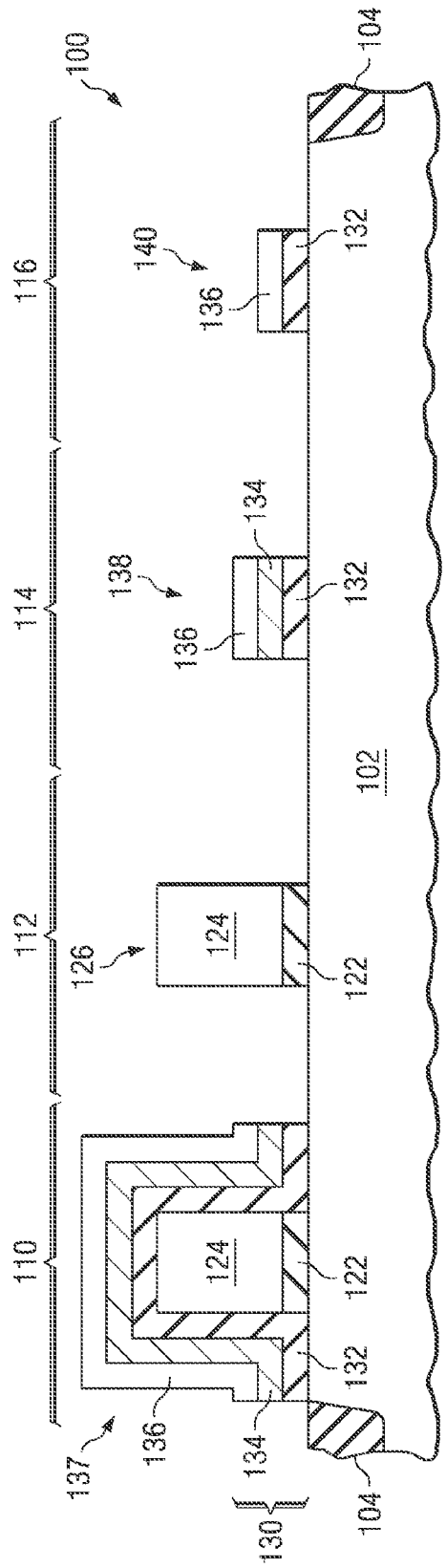

Next, a second material 130 is formed over the workpiece 102 and over the patterned first material 120 in the first region 110 and the second region 112, as shown in FIGS. 3 and 4. The second material 130 comprises a second insulating material 132, a conductive material 134 disposed over the second insulating material 132, and a second semiconductive material 136 disposed over the conductive material 134. The second material 130 is patterned, forming a capacitor dielectric and a second capacitor plate in the first region 110 of the workpiece 102 over the first capacitor plate comprised of the first semiconductive material 124 and forming a second element 138 in the third region 114 of the workpiece 102, as shown in FIG. 5.

Referring again to FIG. 3, to form the second material 130, the second insulating material 132 is deposited over the workpiece 102 and over the patterned first material 120 in the first region 110 and the second region 112. The second insulating material 132 may comprise about 1 to 10 nm of a dielectric material such as $Si_3N_4$, SiON, or other high-k dielectric materials having a dielectric constant k of greater than about 3.9, or combinations and/or multiple layers thereof, as examples. Alternatively, the second insulating material 132 may comprise other dimensions and materials, for example. The second insulating material 132 may be formed using an oxidation or nitridation process, CVD, ALD, MOCVD, PVD, a spin-on process, or JVD, or combinations thereof, as examples, although alternatively, other methods may also be used to form the second insulating material 132. The second insulating material 132 may be substantially conformal as deposited, conforming to the shape and topography of the patterned first material 120, as shown.

The conductive material 134 of the second material 130 is deposited or formed over the second insulating material 132, as shown in FIG. 3. The conductive material 134 may comprise about 3 to 30 nm of a conductive material such as TiN, TaN, TiC, TiCN, MoN, other metals, or combinations and/or multiple layers thereof, as examples. In some embodiments, the conductive material 134 may comprise a thickness of about 10 nm, for example. Alternatively, the conductive material 134 may comprise other dimensions and materials, for example. The conductive material 134 may be formed using CVD, MOCVD, PVD, a sputter process, or combinations thereof, as examples, although alternatively, other methods may also be used to form the conductive material 134. The conductive material 134 may be substantially conformal as deposited, conforming to the topography of the second insulating material 132, as shown.

Next, in an optional step, the conductive material 134 may be patterned using lithography to remove the conductive material 134 from the optional fourth region 116 of the workpiece 102. For example, FIG. 3 shows a cross-sectional view of the semiconductor device 100 after the conductive material 134 has been removed using lithography from the fourth region 116 of the workpiece 102.

The second semiconductive material 136 of the second material 130 is then deposited or formed over the conductive material 134 and over the second insulating material 132 in the fourth region 116, if included, as shown in FIG. 4. The second semiconductive material 136 may comprise about 10 to 200 nm of a semiconductive material such as polysilicon or amorphous silicon, although alternatively, the second semiconductive material 136 may comprise other dimensions and materials. In some embodiments, the second semiconductive material 136 comprises a thickness of about 50 nm, as an example. The second semiconductive material 136 may be formed by CVD, PVD, or other methods, as examples. The second semiconductive material 136 may be substantially conformal as deposited, conforming to the topography of the underlying conductive material 134 and the second insulating material 132, as shown.

The second material 130 is patterned using a lithography process, forming a second capacitor plate in the first region 110 of the workpiece 102 and forming a second element 138 in the third region 114 of the workpiece 102, as shown in FIG. 5. The patterned second material 130 and the patterned first material 120 comprise a capacitor 137 in the first region 110 of the workpiece 110. The patterned second insulating material 132 comprises a capacitor dielectric of the capacitor 137 in the first region 110. The conductive material 134 and the second semiconductive material 136 comprise the second capacitor plate of the capacitor 137.

In some embodiments, after patterning the second material 130, the second element 138 in the third region 114 may comprise a transistor, as an example. The second insulating material 132 comprises a gate dielectric, and the conductive material 134 and the second semiconductive material 136 comprise a gate of the transistor, in these embodiments. Alternatively, the second element 138 may comprise other devices, such as a resistor or other devices. The second element 138 comprises the second insulating material 132, the conductive material 134, and the second semiconductive material 136.

The patterning of the second material 130 may comprise removing the second material 130 from over the first element 126 in the second region 112 of the workpiece 102, as shown in FIG. 5. For example, patterning the second material 130 may comprise removing the second semiconductive material 136, the conductive material 134, and the second insulating material 132 from over the first element 126 that may comprise a resistor in the second region 112 of the workpiece 102.

Figure 6:
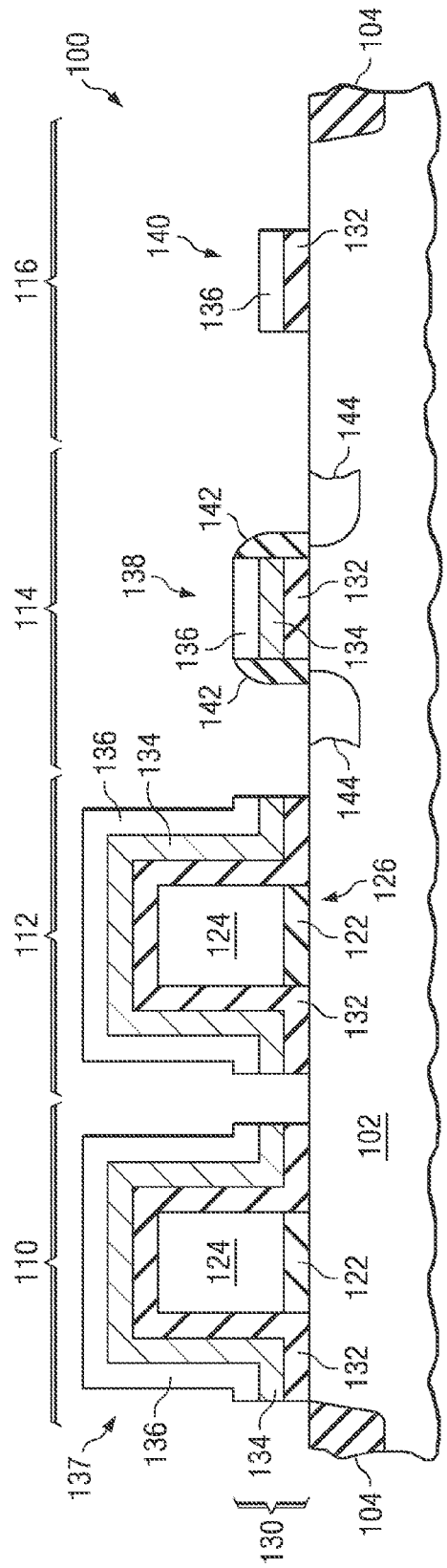

In another embodiment, the patterning of the second material 130 may comprise leaving the second material 130 over the first element 126 in the second region 112 of the workpiece 102, as shown in FIG. 6. Patterning the second material 130 may comprise leaving the second semiconductive material 136, the conductive material 134, and the second insulating material 132 disposed over the first element 126 in the second region 112 of the workpiece 102, for example. The first element 126 may comprise a resistor or a transistor in this embodiment, as examples. The lithography mask for the lithography process used to pattern the second material 130 may comprise the pattern to define which regions 110, 112, 114, or 116 the second material 130 will be removed from or left remaining in.

The type of material of the second semiconductive material 136, the conductive material 134, and the second insulating material 132; the thickness of the second semiconductive material 136, the conductive material 134, and the second insulating material 132; and the dimensions of the patterned second semiconductive material 136, the conductive material 134, and the second insulating material 132 may be selected to achieve desired operating parameters and characteristics such as threshold voltage for the second element 138, e.g., if the second element 138 comprises a transistor. The second element 138 may comprise a width of about 50 nm and may extend in and out of the paper in the view shown in FIG. 6 by 100 nm or greater, or several µm, as examples, depending on the application and the desired operating parameters for the second element 138. The width of the second element 138 may comprise a gate length for transistors of the semiconductor device 100, for example. In some embodiments and in some technology nodes, the width of the second element 138 may comprise about 20 to 50 nm or less, as an example. Alternatively, the second element 138 may comprise other dimensions.

The type of material of the second semiconductive material 136, the conductive material 134, the second insulating material 132, and the first semiconductive material 124; the thickness of the second semiconductive material 136, the conductive material 134, the second insulating material 132, and the first semiconductive material 124; and the dimensions of the patterned second semiconductive material 136, the conductive material 134, the second insulating material 132, and the first semiconductive material 124 may also be selected to achieve desired operating parameters and characteristics such as the capacitance, voltage, and current capabilities for the capacitor 137 in the first region 110, for example.

In the patterning step for the second material 130, an optional third element 140 may also be formed in the optional fourth region 116 of the workpiece 102, as shown in FIG. 5. The third element 140 may comprise a resistor, as an example, although alternatively, the third element 140 may comprise other devices or circuit elements, such as a transistor or other devices. The optional third element 140 may comprise the second insulating material 132 and the second semiconductive material 136, for example.

Advantageously, the type of materials and dimensions used for the second semiconductive material 136, the conductive material 134, the second insulating material 132, and the first semiconductive material 124 may be adjusted and/or tuned to achieve the desired properties and operating characteristics for the capacitor 137, the first element 126, the second element 138, and the optional third element 140, in accordance with embodiments of the present invention. The capacitance strength may be adjusted by modifying or altering the width and length of the second semiconductive material 136, the conductive material 134, the second insulating material 132, and the first semiconductive material 124 of the capacitors 137, as an example.

The second material 130 may be patterned by depositing a layer of photosensitive material (not shown) over the second semiconductive material 136, and patterning the layer of photosensitive material using a lithography process, as described for patterning of the first material 130, for example.

Processing of the semiconductor device 100 is then continued to complete the fabrication process. For example, an insulating sidewall spacer material 142 may be deposited over the workpiece 102 and may be anisotropically etched to form sidewall spacers 142 on sidewalls of the second element 138 in the third region 114 of the workpiece 102, as shown in FIG. 6. Source and drain regions 144 of the second element 138 may be formed or implanted into the workpiece 102, e.g., before and/or after the formation of the sidewall spacers 142, also shown in FIG. 6.

Additional insulating material layers or inter-level dielectric (ILD) layers may be deposited over the workpiece 102 over the patterned first and second materials 120 and 130, and conductive materials may be formed in the insulating material layers to form contacts, vias, and/or conductive lines over the workpiece 102, the capacitor 137, the first element 126, the second element 138, and the optional third element 140 to make electrical contact to portions of the workpiece 102, the capacitor 137, the first element 126, the second element 138, and the optional third element 140, for example, not shown.

For example, if the first element 126 comprises a resistor, a first conductive line may be coupled to a first end of the resistor and a second conductive line may be coupled to a second end of the resistor (not shown). If the second element 138 comprises a transistor, a first contact may be coupled to the gate 134/136 of the transistor and at least one second contact may be coupled to the source and/or drain 144 of the transistor (also not shown). A first portion of the semiconductor device 100 may be coupled to the first capacitor plate 124 of the capacitor 137 and a second portion of the semiconductor device 100 may be coupled to the second capacitor plate 134/136 of the capacitor 137, also not shown. For example, the capacitor plates 124 and 134/136 may be coupled to the first element 126, the second element 138, the third element 140, and/or regions of the workpiece 102 or other circuit elements of the workpiece 102 using capacitor connectors or contacts.

Additional insulating material layers and conductive material layers, e.g., metallization layers, may be formed over the novel capacitors 137 and may be used to interconnect the various components of the semiconductor device 100.

Figure 7:
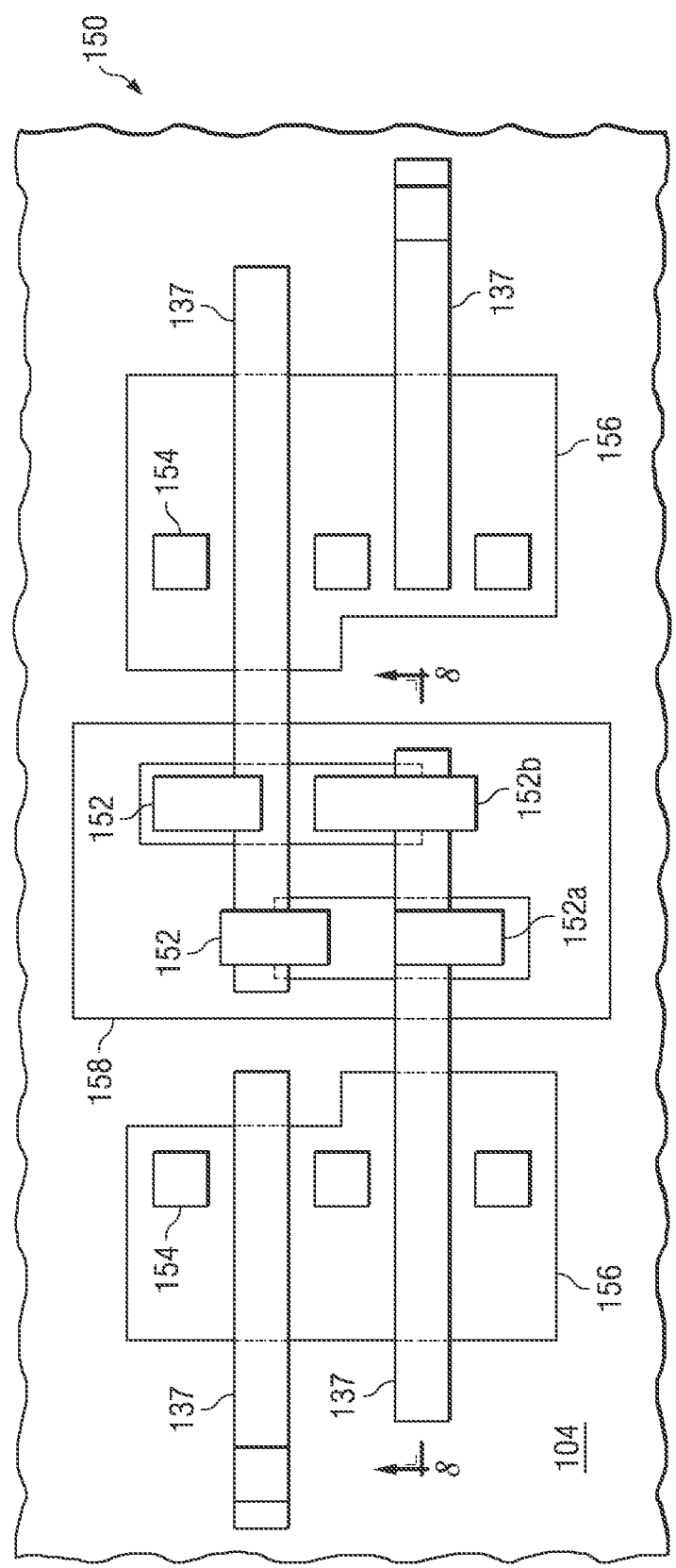
FIG. 7 shows a top view of a plurality of capacitors of the present invention implemented in a static random access memory (SRAM) core cell.
Figure 8:
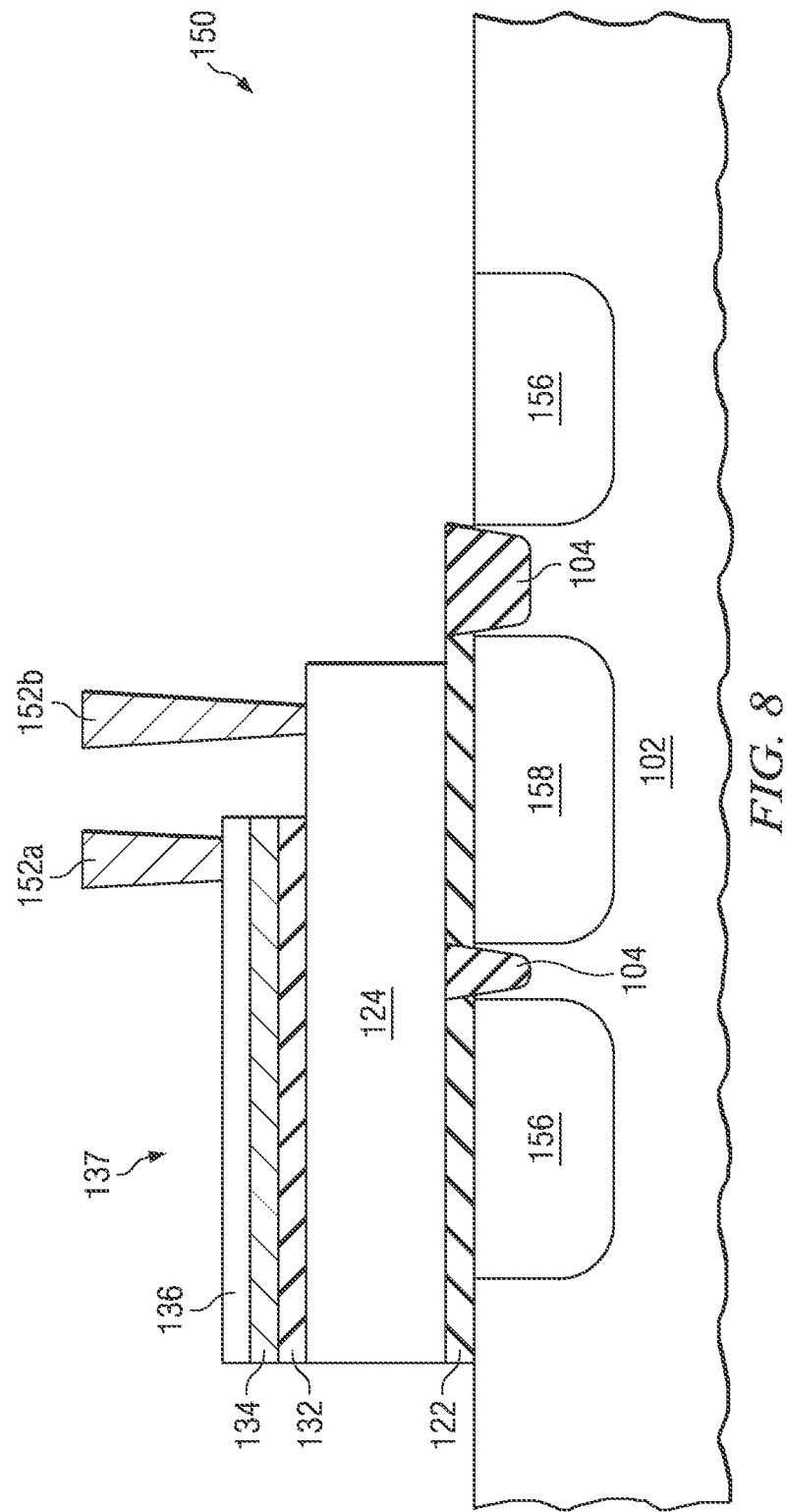
FIG. 8 shows a cross-sectional view of a portion of a capacitor of the SRAM core cell shown in FIG. 7.

FIG. 7 shows a top view of a plurality of capacitors 137 of the present invention implemented in a SRAM core cell 150. FIG. 8 shows a cross-sectional view of a portion of a capacitor 137 of the SRAM core cell 150 shown in FIG. 7 at 8-8. Like numerals are used for the various elements that were used to describe the previous figures, and to avoid repetition, each reference number shown in FIGS. 7 and 8 is not described again in detail herein.

The SRAM core cell 150 shown in FIGS. 7 and 8 comprises a 6T core-cell high-k metal gate capacitance SRAM core cell adapted to operate at a minimum supply voltage. The capacitors 137 of the SRAM core cell 150 may be used for low voltage and SER improvement in some embodiments, for example. Capacitor connectors 152, 152a, and 152b comprise rectangular-shaped or elongated contacts that are used to connect the capacitors 137 to other portions of the SRAM core cell 150. Capacitor connector 152a connects the top plate 134/136 of the capacitor 137 to other regions of the SRAM core cell 150, and capacitor connector 152b connects the bottom plate 124 of the capacitor 137 to other regions of the SRAM core cell 150, as shown in FIG. 8. The first insulating material 122 of the first material 120 isolates the bottom plate 126 from active areas of the workpiece 102, such as P wells 156 and N wells 158 formed in the workpiece 102. Contacts 154 may be used to connect various regions and portions of the SRAM core cell 150, for example. Isolation regions 104 formed in the workpiece 102 may extend above a top surface of the workpiece 102, as shown.

Figure 9:
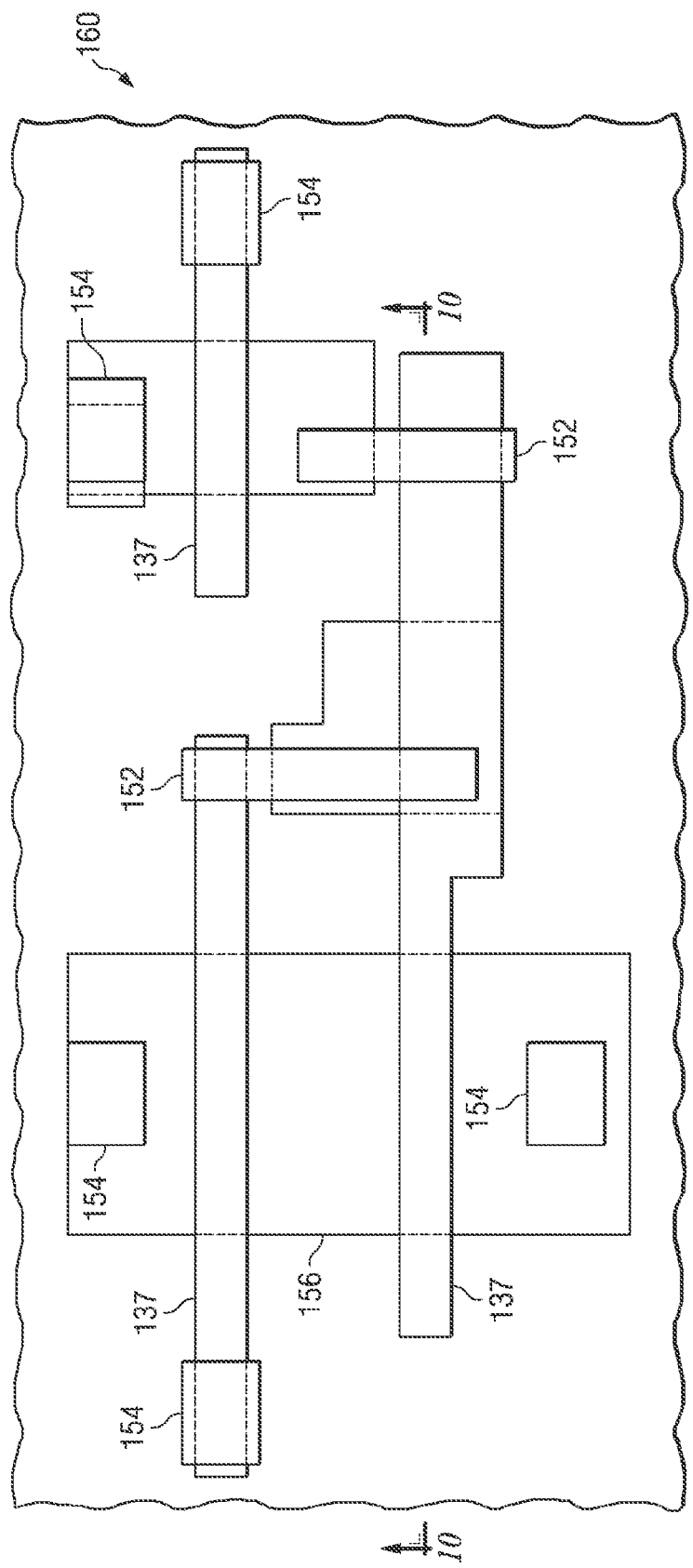
FIG. 9 shows a top view of a plurality of capacitors of the present invention implemented in another SRAM core cell.
Figure 10:
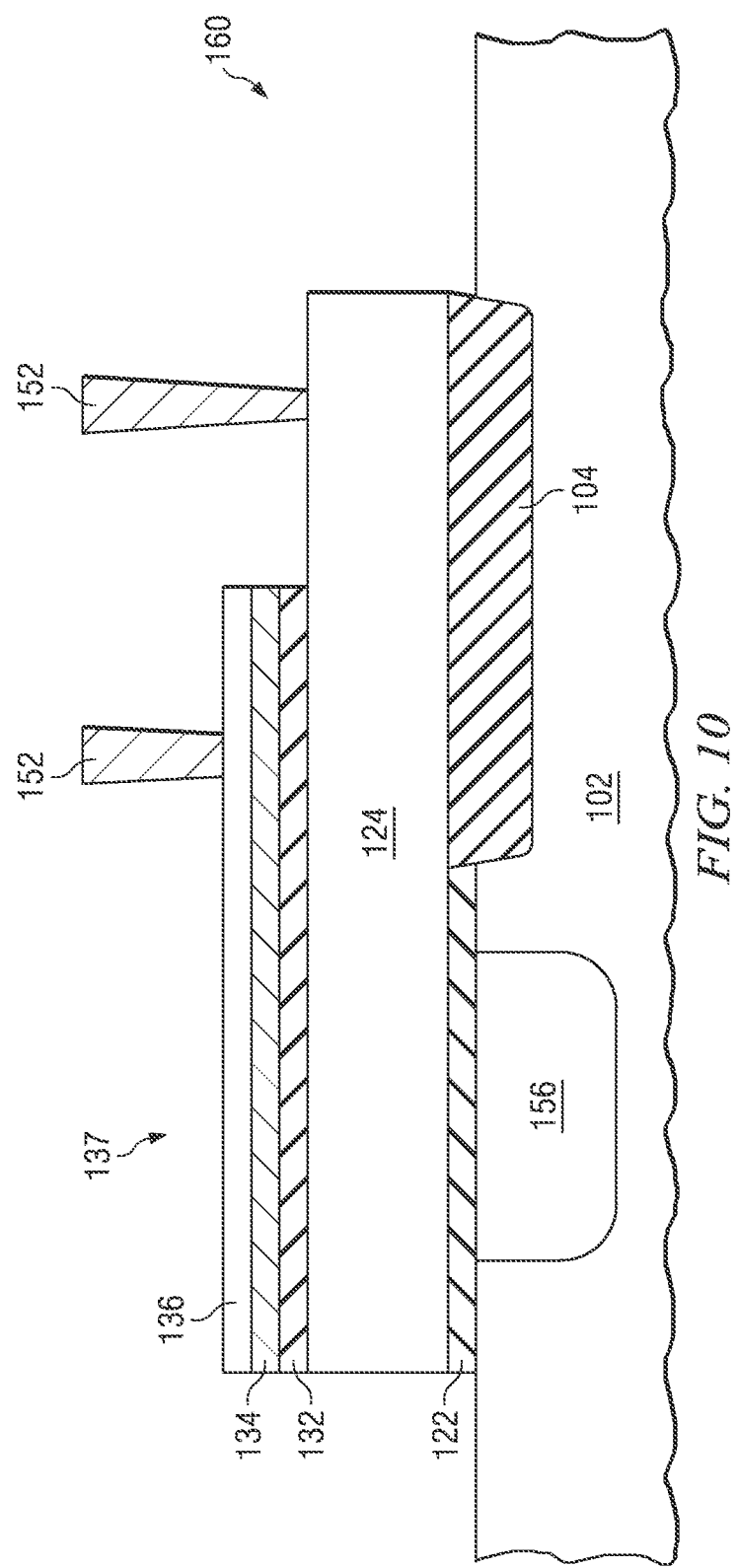
FIG. 10 shows a cross-sectional view of a portion of a capacitor of the SRAM core cell shown in FIG. 9.

FIG. 9 shows a top view of a plurality of capacitors 137 of the present invention implemented in another SRAM core cell 160. FIG. 10 shows a cross-sectional view of a portion of a capacitor 137 of the SRAM core cell 160 shown in FIG. 9 at 10-10. Again, like numerals are used for the various elements that were used to describe the previous figures, and to avoid repetition, each reference number shown in FIGS. 9 and 10 is not described again in detail herein.

The SRAM core cell 160 shown in FIGS. 9 and 10 comprises a 3T core-cell high-k metal gate capacitance implementation. The capacitors 137 of the SRAM core cell 160 may be used to store content in some embodiments, for example. As in the embodiment shown in FIGS. 7 and 8, capacitor connectors 152 may be used to connect the capacitors 137 to other portions of the SRAM core cell 160. The first insulating material 122 of the first material 120 isolates the bottom plate 126 of the capacitors 137 from active areas of the workpiece 102, such as P well 156 formed in the workpiece 102. Contacts 154 may be used to connect various regions and portions of the SRAM core cell 160, for example.

In the drawings, the ends of the capacitor 137 plates 124 and 134/136 are shown as being substantially square; alternatively, due to the lithography processes used to pattern the capacitor 137 plates 124 and 134/136, the ends of the capacitor 137 plates 124 and 134/136 may also be rounded, for example, not shown.

The patterns for the capacitors 137 may be included in existing mask levels for the semiconductor device 100. However, optionally, dedicated lithography and etch processes may also be used to fabricate the capacitors 137 described herein. For example, patterning the first semiconductive material 124 and the first insulating material 122 may comprise using a first lithography mask (not shown). The first lithography mask may comprise a lithography mask for patterning the first element 126, altered to include the pattern for the first capacitor plate of the capacitor 137, for example. Alternatively, the first lithography mask may comprise a dedicated lithography mask for patterning the first capacitor plate of the capacitor 137 and the first element 126. Patterning the second semiconductive material 136, the conductive material 134, and the second insulating material 132 may comprise using a second lithography mask (also not shown). The second lithography mask may comprise a lithography mask for patterning the second element 138, altered to include the pattern for the second capacitor plate and the capacitor dielectric of the capacitor 137, for example. Alternatively, the second lithography mask may comprise a dedicated lithography mask for patterning the second capacitor plate and the capacitor dielectric of the capacitor 137 and the second element 138.

Embodiments of the present invention include methods of fabricating the semiconductor devices 100 and capacitor plates 137 described herein during the fabrication process for other elements 126, 138, and 140 of the semiconductor devices 100, for example. Embodiments of the present invention also include semiconductor devices 100 and capacitors 137 comprising the novel capacitor plates 124 and 134/136.

For example, referring again to FIG. 5, in accordance with an embodiment of the present invention, a semiconductor device 100 includes a capacitor 137 in a first region 110 of a workpiece 102. A first element 126 is disposed in a second region 112 of the workpiece 102, the first element 126 comprising a first semiconductive material 124. A second element 138 is disposed in a third region 114 of the workpiece 102, the second element 138 comprising an insulating material 132, a conductive material 134, and a second semiconductive material 136. A first plate of the capacitor 137 comprises the first semiconductive material 124 of the first element 126. The capacitor 137 comprises a capacitor dielectric comprising the insulating material 132 of the second element 138. The capacitor 137 comprises a second plate comprising the conductive material 134 and the second semiconductive material 136 of the second element 138. The first element 126 or the second element 138 may comprise a resistor or a transistor, for example.

The semiconductor device 100 may further comprise a third element 140 disposed in a fourth region 116 of the workpiece 102, wherein the third element 140 comprises the insulating material 132 and the second semiconductive material 136 of the second element 138. The third element may be different than the first element 126 or the second element 138, for example. The first element 126, the second element 138, and/or the third element 140 may comprise a resistor or a transistor.

The capacitor 137 may be disposed proximate a memory device of the semiconductor device 100, as shown in FIGS. 7 through 10. The semiconductor device 100 may further comprise a connector element such as capacitor connectors 152, 152a, and 152b shown in FIGS. 7 through 10 coupling the capacitor 137 to a portion of the memory device, for example. The memory device may comprise an SRAM core cell 150 or 160 or other types of memory devices. The capacitors 137 may comprise storage devices as shown in FIGS. 9 and 10 or soft error rate (SER) protection devices as shown in FIGS. 7 and 8, as examples. The embodiments shown in FIGS. 7 through 10 are merely examples; alternatively, the novel capacitors 137 described herein may also be implemented in other sizes of SRAM core cells, such as 1T, 8T, or other sizes. Alternatively, the capacitors 137 described herein may be implemented in other applications. For example, the capacitors 137 may be implemented in SRAM core cells, other types of memory devices than SRAM core cells, storage devices, SER protection or robustness circuits, logic circuits, filters, analog-to-digital converters, control circuits, memory devices, voltage regulators, delay circuits, storage enhancement circuits, or SRAM/read only memory (ROM) support circuits, as examples.

Advantages of embodiments of the present invention include providing novel methods of manufacturing semiconductor devices 100 and capacitors 137. The capacitors 137 are formed by overlaying a resistor material (e.g., the first insulating material 122 and the first semiconductive material 124) with a transistor material (e.g., the second insulating material 132, the conductive material 134, and the second semiconductive material 136).

The novel capacitors 137 advantageously may be formed during the fabrication and lithography processes used to form other elements 126, 138, and 140 of the semiconductor devices 100 in some embodiments, and thus do not require any additional processing steps, lithography masks, or costs. Additional etch processes and lithography processes are not required to manufacture the novel capacitors 137 in accordance with some embodiments of the present invention. For example, the patterns for the first plates 124 and the second plates 134/136 may be included in existing mask levels for the semiconductor device 100. However, optionally, dedicated lithography and etch processes may also be used to fabricate the capacitors 137 described herein.

The novel manufacturing methods for the capacitors 137 described herein provide flexibility in the placement and shaping of capacitors 137 of semiconductor devices 100. In some embodiments, the capacitor plates 124 and 134/136 may be ground-rule based, comprising a width of a minimum feature size of a semiconductor device 100 and achieving a high capacitance value, for example. In some embodiments, the second insulating material 132 comprises a high k material, achieving a large amount of capacitance for the capacitors 137 per unit area, for example. The capacitors 137 may be small, yet may provide a large amount of capacitance, because a high k material is used for the capacitor dielectric (e.g., the second insulating material 132), for example.

Another advantage of embodiments of the present invention is that resistors such as the first element 126 in the second region 112 or the third element 140 in the fourth region 116 of the workpiece 102 may be formed that have a different thickness than a thickness of the gate material 134/136 of transistors such as the second element 138 in the third region 114, for example. Because the resistors 126 or 140 are formed from different materials 124 and 136 and using a different processing step than the transistor gate 134/136, the thickness of the resistors 126 or 140 is not required to be the same as and is not limited by the thickness of the transistor gate 134/136.

Only one capacitor 137 is shown in the first region 110 in FIGS. 1 through 6; however, in accordance with embodiments of the present invention, a plurality of capacitors 137 may be formed across a surface of a workpiece 102, e.g., in a gate level, resistor level, and/or other levels of the semiconductor device 100.

In some embodiments, the plates 124 and 134/136 of the capacitors 137 may have substantially the same or similar dimensions as other features or devices such as resistors or transistors formed in the material layers 124 and 134/136, so that the capacitors 137 are easily integratable into existing semiconductor device 100 structures and manufacturing process flows. The capacitors 137 are small, fast, and low in complexity and cost. The properties of the capacitors 137 may be tuned by adjusting the capacitor dielectric 132 thickness and materials and the dimensions of the plates 124 and 134/136, as examples. Advantageously, the top plate 134/136 of the capacitors 137 comprises a metal (e.g., conductive material 134).

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a capacitor, the method comprising:
    forming a first material over a workpiece;
    patterning the first material, forming a first capacitor plate in a first region of the workpiece and forming a first element in a second region of the workpiece;
    forming a second material over the workpiece and over the patterned first material, wherein forming the second material comprises forming a second insulating material, forming a conductive material over the second insulating material, and forming a second semiconductive material over the conductive material; and
    patterning the second material, forming a capacitor dielectric and a second capacitor plate in the first region of the workpiece over the first capacitor plate and forming a second element in a third region of the workpiece.

2. The method according to claim 1, wherein forming the first material comprises forming a first insulating material over the workpiece and forming a first semiconductive material over the first insulating material.

3. The method according to claim 1, wherein patterning the second material comprises forming a third element in a fourth region of the workpiece.

4. The method according to claim 3, further comprising, before forming the second semiconductive material, removing the conductive material from the fourth region of the workpiece.

5. The method according to claim 4, wherein forming the third element comprises forming a transistor and wherein forming a fourth element comprises forming a resistor.

6. The method according to claim 1, wherein forming the first element comprises forming a resistor.

7. The method according to claim 1, wherein forming the second element comprises forming a transistor, further comprising forming source and drain regions of the transistor, before or after patterning the second material.

8. A method of manufacturing a semiconductor device, the method comprising:
    forming a first insulating material over a workpiece;
    forming a first semiconductive material over the first insulating material;
    patterning the first semiconductive material and the first insulating material thereby forming a first capacitor plate in a first region of the workpiece and forming a first element in a second region of the workpiece;
    forming a second insulating material over the first capacitor plate, the first element, and the workpiece;
    forming a conductive material over the second insulating material;
    forming a second semiconductive material over the conductive material; and
    patterning the second semiconductive material, the conductive material, and the second insulating material thereby forming a second capacitor plate and a capacitor dielectric over the first capacitor plate, and forming a second element in a third region of the workpiece.

9. The method according to claim 8, wherein forming the first insulating material comprises forming about 0.5 nm to about 5 nm of a first high-k dielectric material.

10. The method according to claim 9, wherein forming the first semiconductive material comprises forming about 10 nm to about 200 nm of polysilicon or amorphous silicon.

11. The method according to claim 10, wherein forming the second insulating material comprises forming about 1 nm to about 10 nm of a second high-k dielectric material.

12. The method according to claim 11, wherein forming the conductive material comprises forming about 3 nm to about 30 nm of TiN, TaN, TiC, TiCN or MoN, and wherein forming the second semiconductive material comprises forming about 10 nm to about 200 nm of polysilicon or amorphous silicon.

13. The method according to claim 8, wherein forming the first element in the second region comprises forming a resistor, wherein forming the second element in the third region comprises forming a transistor, the second semiconductive material and the conductive material comprising a gate of the transistor, and wherein the method further comprises:

coupling a first conductive line to a first end of the resistor and coupling a second conductive line to a second end of the resistor; and coupling a first contact to the gate of the transistor and at least one second contact to a source or drain of the transistor.

14. The method according to claim 8, wherein patterning the second semiconductive material, the conductive material, and the second insulating material comprises leaving the second semiconductive material, the conductive material, and the second insulating material disposed over the first element in the second region of the workpiece, or wherein patterning the second semiconductive material, the conductive material, and the second insulating material comprises removing the second semiconductive material, the conductive material, and the second insulating material from over the first element in the second region of the workpiece.

15. The method according to claim 8, further comprising:

using a first lithography mask to pattern the first semiconductive material and the first insulating material to form the first capacitor plate and the first element, wherein the first lithography mask comprises a lithography mask for patterning the first element altered to include a pattern for the first capacitor plate, or wherein the first lithography mask comprises a dedicated lithography mask for patterning the first capacitor plate and the first element; and using a second lithography mask to pattern the second semiconductive material, the conductive material, and the second insulating material, wherein the second lithography mask comprises a lithography mask for patterning the second element altered to include a pattern for the second capacitor plate and the capacitor dielectric, or wherein the second lithography mask comprises a dedicated lithography mask for patterning the second capacitor plate, the capacitor dielectric, and the second element.

16. A method of manufacturing a semiconductor device, the method comprising:

forming a first insulating material over a workpiece;

forming a first semiconductive material over the first insulating material;

patterning the first semiconductive material and the first insulating material thereby forming a first capacitor plate in a first region of the workpiece, and forming a first element in a second region of the workpiece;

forming a second insulating material over the first capacitor plate, the first element, and the workpiece;

forming a conductive material over the second insulating material, the first region, the second region and a third region;

forming a second semiconductive material over the conductive material and the insulating material;

patterning the second semiconductive material, the conductive material, and the second insulating material thereby forming a second capacitor plate and a capacitor dielectric over the first capacitor plate, and forming a second element in the third region of the workpiece; and patterning the second semiconductive material and the second insulating material thereby forming a third element in a fourth region of the workpiece.

17. The method according to claim 16, wherein forming the first element comprises forming a resistor in the second region, wherein forming the second element in comprises forming a transistor in the third region.

18. The method according to claim 16, wherein forming the first element comprises forming a first capacitor plate in the second region, wherein forming the second element comprises forming a transistor in the third region.

19. The method according to claim 16, wherein forming the third element comprises forming a resistor in the fourth region.

* * * * *